United States Patent
Gundurao et al.

(10) Patent No.: US 7,319,729 B2
(45) Date of Patent: Jan. 15, 2008

(54) ASYNCHRONOUS INTERFACE METHODS AND APPARATUS

(75) Inventors: Seetharam Gundurao, Bangalore (IN); Kenneth A. Lauricella, Colchester, VT (US); Clarence R. Ogilvie, Huntington, VT (US); Nishant Sharma, New Delhi (IN); Richard N. Wilson, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 827 days.

(21) Appl. No.: 10/605,405

(22) Filed: Sep. 29, 2003

(65) Prior Publication Data

US 2005/0069068 A1 Mar. 31, 2005

(51) Int. Cl.
*H04L 7/00* (2006.01)
(52) U.S. Cl. ........................................ 375/354
(58) Field of Classification Search ........ 375/219–220, 375/257, 295, 316, 356, 377; 370/503
See application file for complete search history.

(56) References Cited

U.S. PATENT DOCUMENTS

| | | | |
|---|---|---|---|
| 4,839,534 A | 6/1989 | Clasen | |
| 5,712,883 A * | 1/1998 | Miller et al. | 375/371 |
| 5,721,953 A | 2/1998 | Fogg, Jr. et al. | |
| 5,745,533 A * | 4/1998 | Asada et al. | 375/354 |
| 5,970,052 A * | 10/1999 | Lo et al. | 370/241 |
| 6,813,724 B2 * | 11/2004 | Saito | 713/401 |
| 7,123,660 B2 * | 10/2006 | Haq et al. | 375/257 |

FOREIGN PATENT DOCUMENTS

| | | |
|---|---|---|
| JP | 2119333 | 7/1990 |
| JP | 3163908 | 7/1991 |
| WO | WO 81/03729 | 12/1981 |

\* cited by examiner

*Primary Examiner*—Khanh C. Tran
(74) *Attorney, Agent, or Firm*—Michael Lestrange; Dugan & Dugan PC

(57) ABSTRACT

In a first aspect of the invention, a first method is provided for aligning signals from a first receiver located in a first clock domain to a second receiver located in a second clock domain. The first method includes the steps of creating a programmable delay element between the first and second receivers, and selectively adding delay via the programmable delay element to the signals until the signals are aligned. Numerous other aspects are provided.

19 Claims, 4 Drawing Sheets

ASYNCHRONOUS INTERFACE METHODS AND APPARATUS

BACKGROUND OF INVENTION

1. Field of the Invention

The present invention relates to asynchronous interface design, and more particularly to improved asynchronous interface methods and apparatus.

2. Background of the Invention

An asynchronous interface may be employed to exchange signals between multiple clock domains. In such instances, it is often difficult to verify that the asynchronous interface functions properly across various alignments of the multiple clocks running at different frequencies. In many cases, such verification does not occur. For example, when signals traveling across an interface experience different delays (e.g., due to differing logic, wiring or other delays), a signal "launched" across the interface first may actually be latched at a receiving side of the interface by a clock cycle that occurs after a clock cycle employed to latch a subsequently transmitted signal. Behavioral simulations, gate-level simulations and static timing tools all may have difficulty modeling such conditions. Accordingly, conventional modeling typically cannot predict whether a state machine on a receiving side of an asynchronous interface will function under "real world" conditions that may produce signal transmission failures.

A need therefore exists for asynchronous interface methods and apparatus that can simulate the actual failing conditions of an interface, and/or that allow such failing conditions to be mitigated and/or eliminated.

SUMMARY OF INVENTION

In a first aspect of the invention, a first method is provided for aligning signals from a first receiver located in a first clock domain to a second receiver located in a second clock domain. The first method includes the steps of creating a programmable delay element between the first and second receivers, and selectively adding delay via the programmable delay element to the signals until the signals are aligned.

In a second aspect of the invention, a second method is provided for aligning signals transmitted between a first receiver located in a first clock domain and a second receiver located in a second clock domain. The second method includes the steps of (a) providing at least one selectable delay for each of a first plurality of signal lines adapted to receive signals transmitted from the first receiver to the second receiver; and (b) providing at least one selectable delay for each of a second plurality of signal lines adapted to receive signals transmitted from the second receiver to the first receiver. The second method further includes the steps of (c) testing operation of the first and second receivers in response to differing delays between signals transmitted between the first and second receivers; (d) determining one or more delays that cause the first and second receivers to exchange signals without errors; and (e) employing the one or more delays during subsequent transmission of signals between the first and second receivers.

Numerous other systems, methods, computer program products and data structures also are provided. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAILED DESCRIPTION

Figure 1:
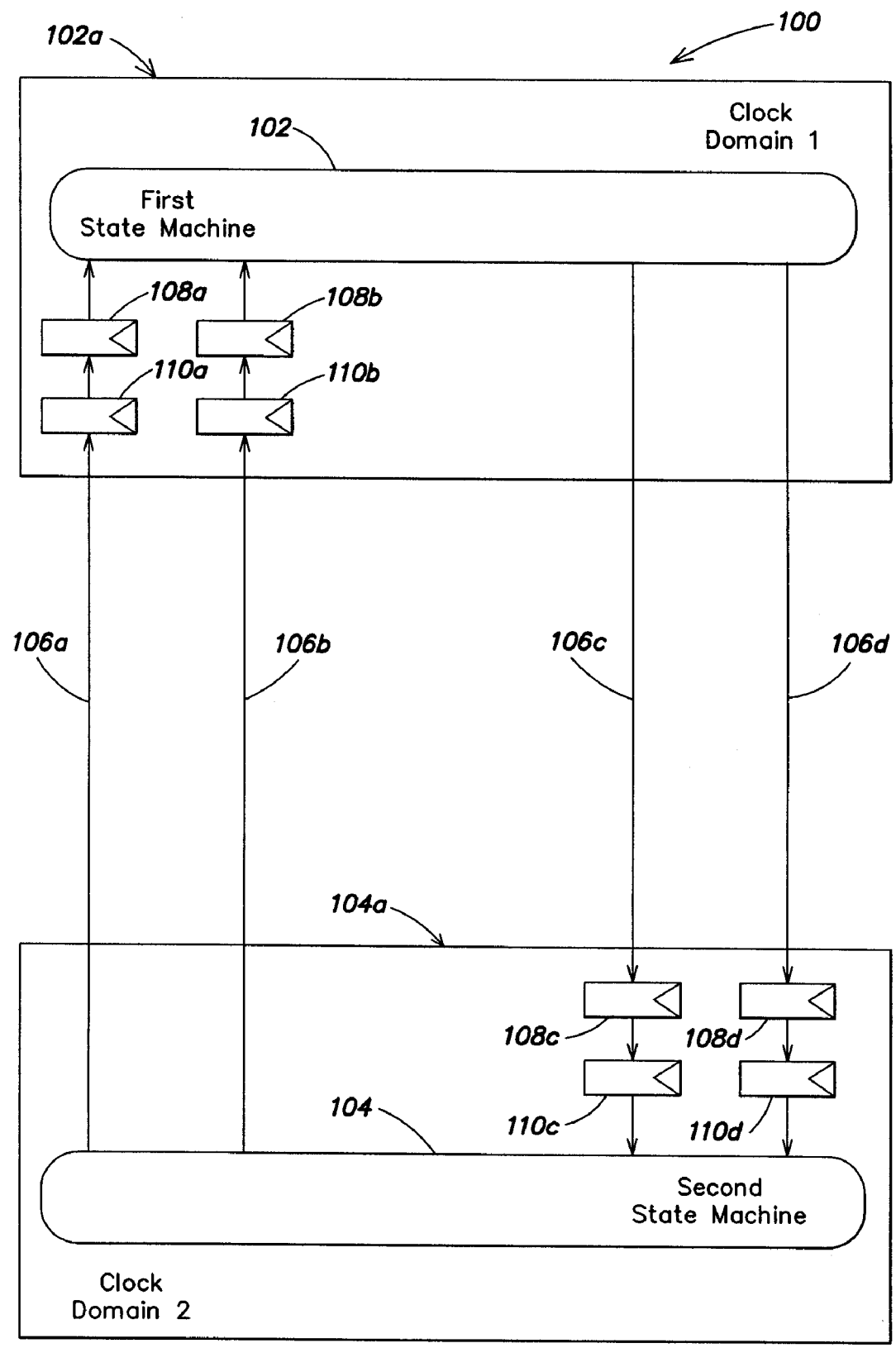
FIG. 1 is a schematic diagram of a conventional asynchronous interface.

FIG. 1 is a schematic diagram of a conventional asynchronous interface 100 for transmitting signals between a first receiver such as a state machine 102 (that operates in a first clock domain 102a) and a second receiver such as a state machine 104 (that operates in a second clock domain 104a) via a plurality of signal lines 106a-d. The first and second signal lines 106a-b may be employed to transmit signals from the second state machine 104 to the first state machine 102. Such signals may be latched into the first state machine 102 via a first plurality of metastability or similar latches 108a, 110a and 108b, 110b, respectively. Likewise, the third and fourth signal lines 106c-d may be employed to transmit signals from the first state machine 102 to the second state machine 104. Such signals may be latched into the second state machine 104 via a second plurality of metastability or similar latches 108c, 110c and 108d, 110d, respectively.

During a typical simulation of the operation of the asynchronous interface 100 of FIG. 1, each signal line 106a-d is assumed to have the same delay (e.g., 0) associated therewith. Accordingly, two or more signals transmitted across the asynchronous interface 100 simultaneously are assumed to arrive at a latch 110a-d at the same time. In practice, the signal lines 106a-d may each have differing logic, wiring or other delays; and the relative position in time between two signals at a receiver side of the asynchronous interface 100 may not be the same as the relative position in time between the two signals when the signals were launched from a transmitter side of the asynchronous interface 100. For example, by the time the latches 108a-b, 110a-b (1) capture the logic state of two signals transmitted from the second state machine 104 to the first state machine 102; and (2) settle to a state, the two signals may be received by the first state machine 102 an entire clock cycle apart (even though the signals were transmitted from the second state machine 104 at approximately the same time). Similarly, by the time the latches 108c-d, 110c-d (1) capture the logic state of two signals transmitted from the first state machine 102 to the second state machine 104; and (2) settle to a state, the two signals may be received by the second state machine 104 an entire clock cycle apart (even though the signals were transmitted from the first state machine 102 at approximately the same time).

To accommodate the differing logic, wiring or other delays of the signal lines 106a-d, the first and second state machines 102, 104 should be resilient enough to function despite an unintended shift in time of as much as a receiver clock cycle between signals transmitted across the asynchronous interface 100. However, for the reasons stated above, conventional simulation techniques typically cannot simulate such potential failure conditions. Further, conventional asynchronous interfaces generally do not allow unintended shifts between signals to be corrected or compensated for without redesign.

Figure 2:
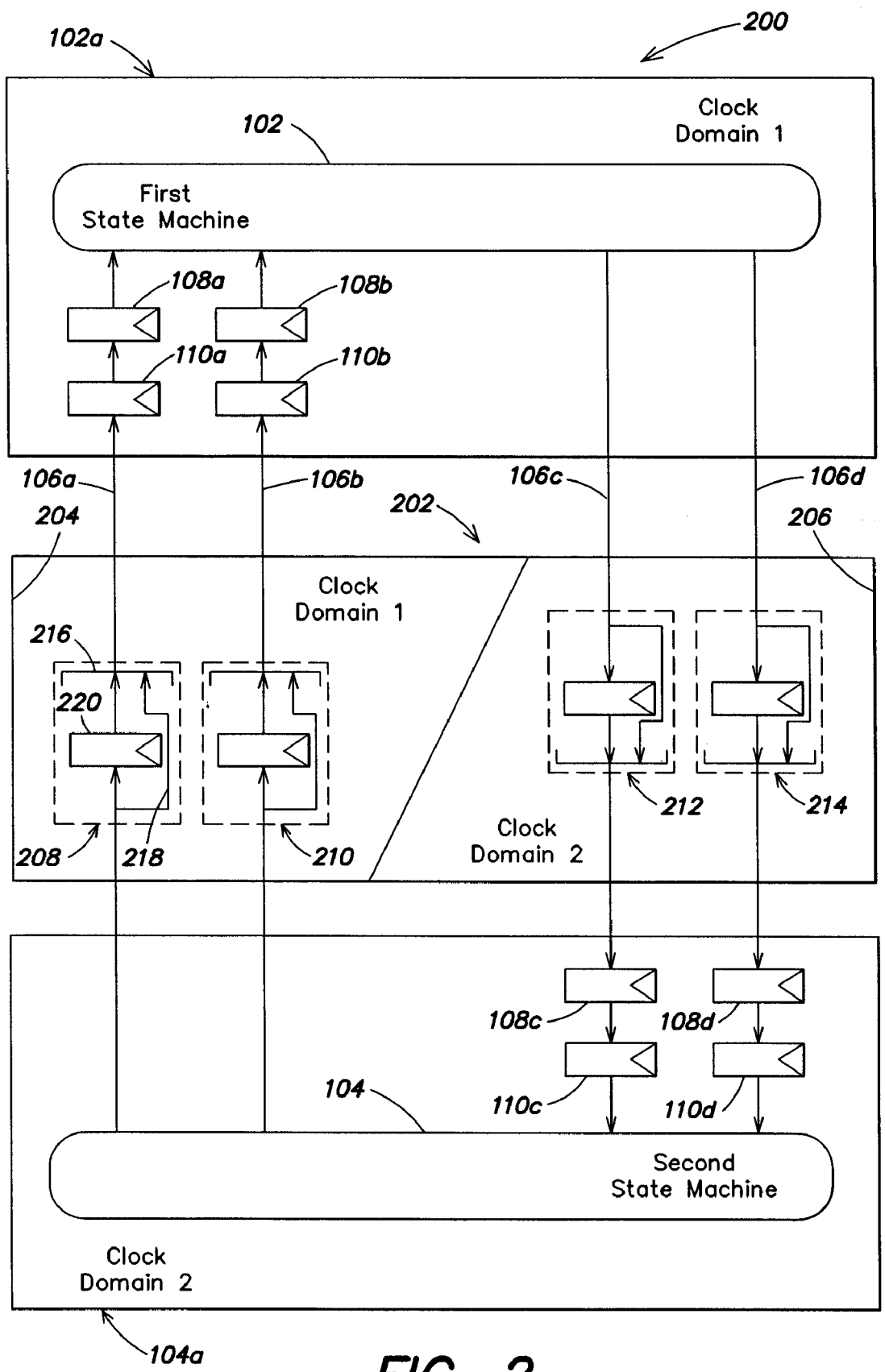
FIG. 2 illustrates a first exemplary asynchronous interface system provided in accordance with the present invention.

FIG. 2 illustrates a first exemplary asynchronous interface system 200 provided in accordance with the present invention. As shown in FIG. 2, the asynchronous interface system 200 includes the components 102-110d of the asynchronous interface 100 of FIG. 1, as well as a supplemental asynchronous interface device (SAID) 202 coupled between the first and second state machines 102, 104.

With reference to FIG. 2, the SAID 202 includes a first clock domain portion 204 and a second clock domain portion 206. The first clock domain portion 204 includes (1) a first delay circuit 208 coupled to the first signal line 106a for selectively introducing a first clock domain clock cycle delay to a signal traveling on the first signal line 106a; and (2) a second delay circuit 210 coupled to the second signal line 106b for selectively introducing a first clock domain clock cycle delay to a signal traveling on the second signal line 106b. That is, each delay circuit 208, 210 may introduce no delay or a one clock cycle delay (in the first clock domain 102a) to a signal traveling on the signal line 106a, 106b.

The second clock domain portion 206 includes (1) a third delay circuit 212 coupled to the third signal line 106c for selectively introducing a second clock domain clock cycle delay to a signal traveling on the third signal line 106c; and (2) a fourth delay circuit 214 coupled to the fourth signal line 106d for selectively introducing a second clock domain clock cycle delay to a signal traveling on the fourth signal line 106d. That is, each delay circuit 212, 214 may introduce no delay or a one clock cycle delay (in the second clock domain 104a) to a signal traveling on the signal line 106c, 106d.

Each delay circuit 208-214 may comprise, for example, a multiplexer-type circuit for selecting between a delayed and non-delayed signal path. For example, the first delay circuit 208 includes a multiplexer or similar logic 216 adapted to select between a non-delay signal path 218 and a signal path that includes a latch 220. The latch 220 is adapted to be latched via a receiver clock (e.g., a clock of the first clock domain 102a in the case of the first delay circuit 208). Multiplexer selection signals may be provided in hardware, software or a combination thereof; and other delay signal configurations may be employed (e.g., additional delay paths, paths with longer delays, etc.).

In operation, the SAID 202 may be employed to delay any (or all) signals that travel across an asynchronous interface (e.g., via signal lines 106a-d) by one receiving clock cycle. For example, simulating interface behavior with many randomly generated tests having signals transmitted across the interface system 200 with different combinations of delays may eventually detect problems with the asynchronous interface system 200 and/or the state machines 102, 104. Alternatively, all possible combinations of random signal delays may be employed during simulated signal transmission across the interface system 200 to exhaustively verify operation of the asynchronous interface system 200 and/or state machines 102, 104. In this manner, the robustness of each state machine 102, 104 to unintended signals delays of up to a clock cycle may be verified (e.g., by skewing signal arrival times under some or all possible conditions). Problems with an asynchronous interface thereby may be found with a logic simulator as part of a normal verification process. Further, such verification may be performed at the behavior-level or gate level.

In one or more embodiments of the invention, the SAID 202 need only be employed during simulation to allow more complete testing/simulation of an asynchronous interface during signal exchange between state machines. Such an approach is simpler than attempting to simulate the various delays associated with each signal line of the asynchronous interface; and may be implemented as one or more computer program products. Each computer program product may include, for example, a netlist of components of the SAID 202 or another simulatable representation of the SAID 202.

To provide further verification options, the SAID 202 may be implemented in hardware as part of an asynchronous interface. For example, the SAID 202 may be included within an asynchronous interface as shown in FIG. 2, and employed to run tests through use of a hardware emulation platform (e.g., by randomly or systematically introducing delays to signals traveling between the state machines 102, 104 so to determine the response/resiliency of the state machines 102, 104). Additional testing also may be performed on any production hardware.

When implemented in hardware, the SAID 202 also may be employed to repair the operation of an otherwise defective interface. For example, the SAID 202 may be employed to permanently introduce a clock cycle delay to one or more signal lines of an asynchronous interface to correct defective operation of the interface. Such delay selection may be achieved for example, by blowing one or more fuses or anti-fuses (not shown) provided with the SAID 202 or via any other suitable technique.

While the present invention has been described with reference to an asynchronous interface that employs four signal lines 106a-d, it will be understood that the present invention may be employed to selectively add delays to any number of signal lines of an asynchronous interface. In additional to adding one clock cycle of delay to one or more signal lines, the present invention may be employed to add additional delays to one or more signal lines (e.g., multiple clock cycle delays).

Figure 3:
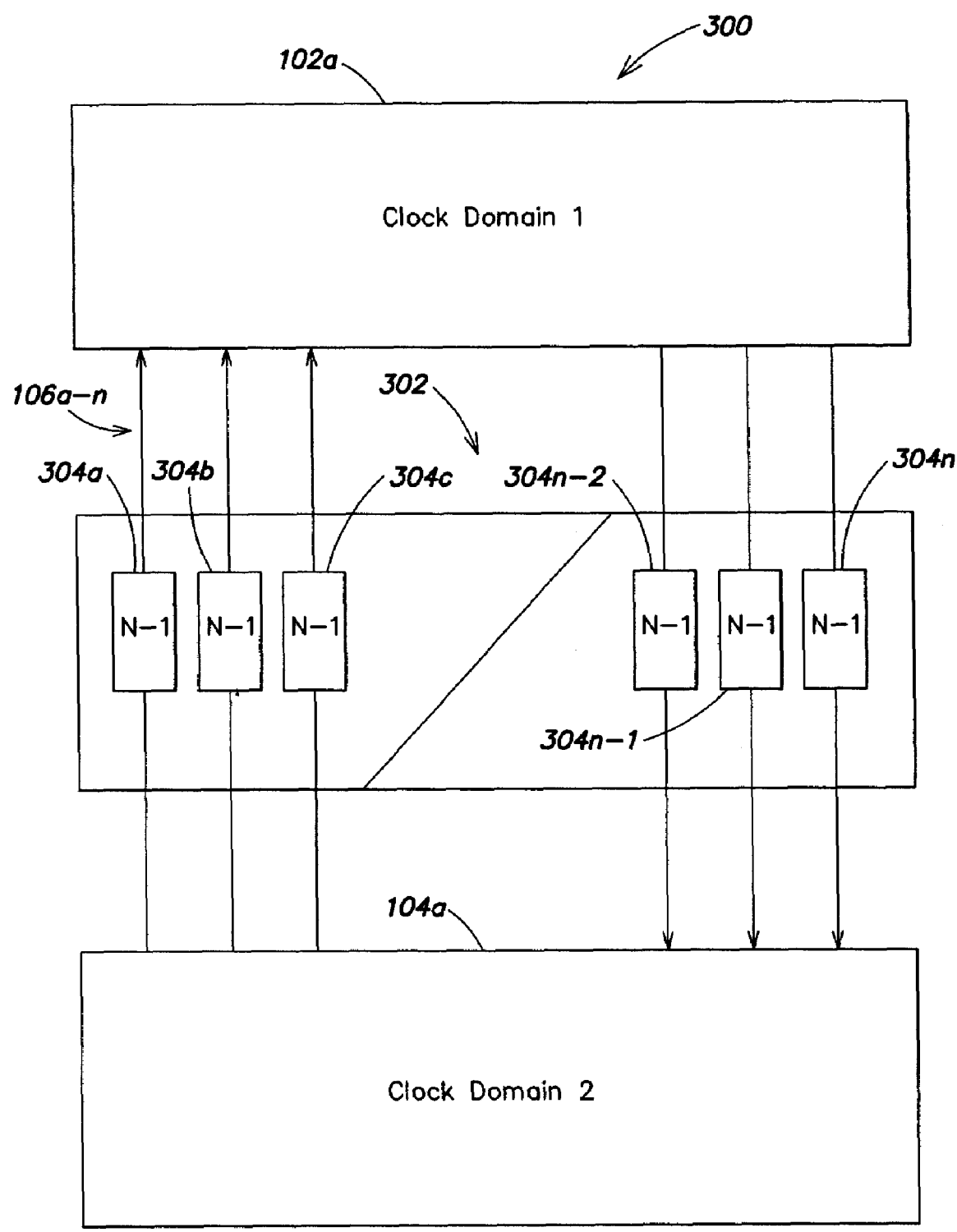
FIG. 3 illustrates a second exemplary asynchronous interface system provided in accordance with the present invention.

FIG. 3 illustrates a second exemplary asynchronous interface system 300 provided in accordance with the present invention. The second exemplary asynchronous interface system 300 is similar to the first exemplary asynchronous interface system 200 of FIG. 2, but employs N signal lines 106a-n between the first and second state machines (not shown in FIG. 3) operating in clock domains 102a, 104a, respectively. In general, any number of signal lines may be employed.

Further, the second exemplary asynchronous interface system 300 includes a plurality of programmable delays for each of the signal lines 106a-n provided via a supplemental asynchronous interface device (SAID) 302. In the embodiment shown, each signal line 106a-n includes up to N–1 programmable delay stages 304a-n. That is, a signal traveling on a signal line 106a-n may be delayed by any amount between 0 and N–1 receiver clock cycles (e.g., in the clock domain of the state machine receiving the signal). Each delay stage may comprise, for example, a plurality of latches that are clocked via a receiver clock, and/or similar hardware to that described with reference to the delay circuits 208-214 of FIG. 2.

Figure 4:
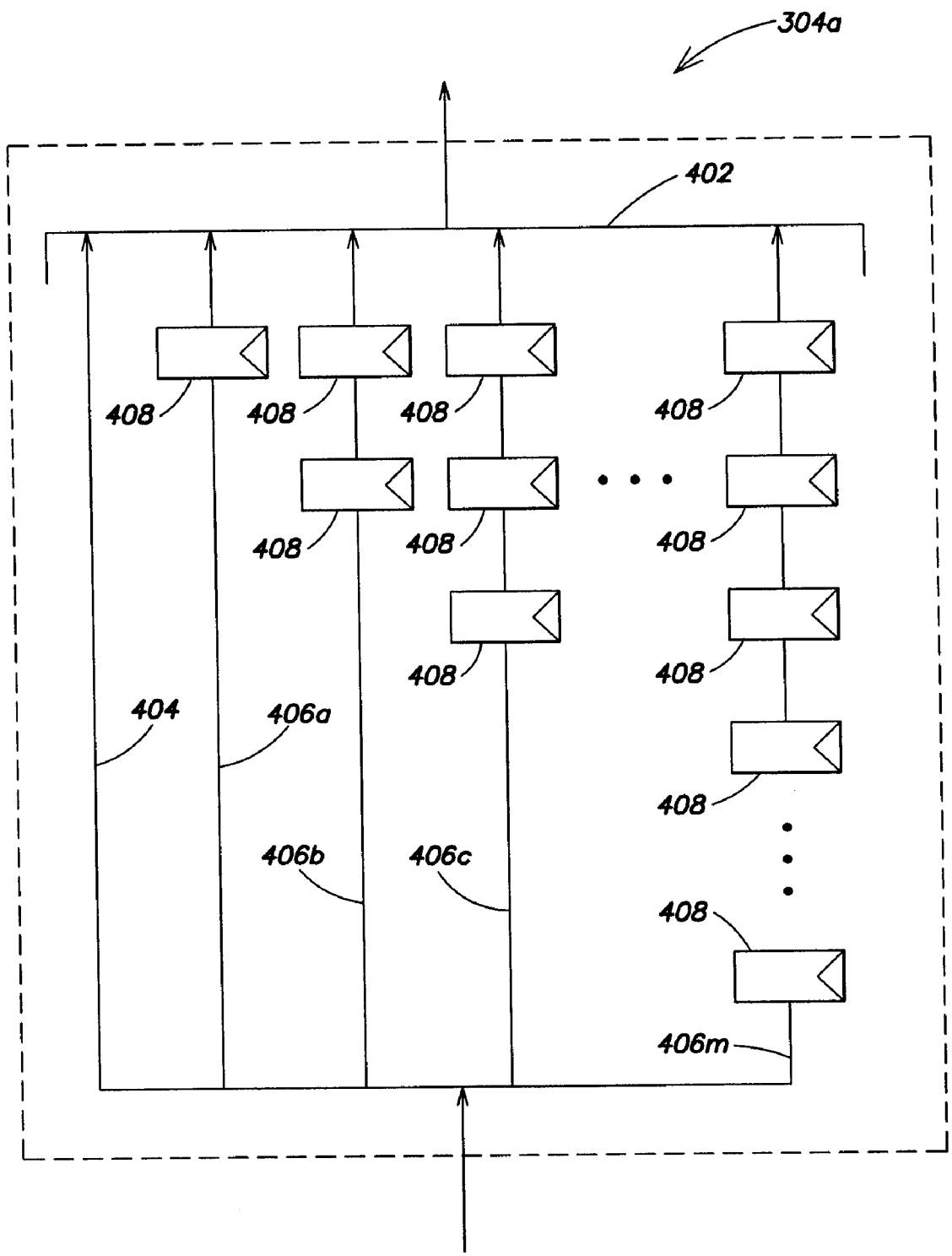
FIG. 4 is an exemplary embodiment of the first programmable delay stage of FIG. 3.

FIG. 4 is an exemplary embodiment of the first programmable delay stage 304a of FIG. 3. The programmable delay stages 304b-n may be similarly configured. As shown in FIG. 4, the programmable delay stage 304a includes a multiplexer or similar logic 402 adapted to select between a non-delay signal path 404a and signal paths 406a-m that include increasing numbers of latches 408 (e.g., from one latch for signal path 406a to n−1 latches for signal path 406m). Each latch 408 is adapted to be latched via a receiver clock (e.g., a clock of the first clock domain 102a in the case of the first programmable delay stage 304a). Multiplexer selection signals may be provided in hardware, software or a combination thereof; and other delay signal configurations may be employed.

When implemented in hardware (e.g., when not employed solely for simulation purposes) the selection of the number of delays per signal line may be performed, for example, by blowing one or more fuses, anti-fuses, or the like. Providing up to N−1 selectable delays per signal line allows greater flexibility for altering signal line delays to correct interface errors, and in most cases, the sequence of N interface signals may be altered to correct errors without requiring redesign. Likewise, the provision of up to N−1 selectable delays during simulation allow further testing options.

In one embodiment of the invention, every control vector of the N×N−1 delay latch matrix associated with the SAID 302 may be employed to test operation of the asynchronous interface system 300 exhaustively. For example, if the asynchronous interface system 300 employs five signal lines, a control vector of (0 0 0 0 0) would cause no delay on any signal line, a control vector of (0 0 0 0 1) would cause one receiver clock cycle delay on the $5^{th}$ signal line, a control vector of (0 0 0 1 2) would cause a one receiver clock delay on the $4^{th}$ signal line and a two receiver clock delay on the $5^{th}$ signal line, etc. One possible algorithm for performing such an exhaustive test may be implemented as follows:

```
Control_vector = − 1
Do {
    Increment Control_vector
    Run test
}
```

Other testing algorithms similarly may be employed.

Testing in accordance with the present invention may be performed in any manner. For example, testing may be performed on a standalone tester under tester control. Likewise, a control vector (e.g., Control_vector) may be visible to software in an actual use environment. Accordingly, if a problem is detected during testing, a diagnostic routine may be employed to identify/employ the control_vector required to correct the problem (e.g., the system 300 may be self-healing and/or employ self-healing software/hardware). For example, the inventive system may be designed to automatically test for, detect and/or repair interface problems in an actual use environment (e.g., by employing control vectors to test the interface and detect the error, by identifying a control vector that will correct the error and by employing the control vector to select the appropriate number of delays per signal line to correct the error). Such a process may be implemented, for example, as one or more computer program products (e.g., operable with one or more controllers and/or processes of a testing system (not shown)).

The foregoing description discloses only exemplary embodiments of the invention. Modifications of the above disclosed apparatus and method which fall within the scope of the invention will be readily apparent to those of ordinary skill in the art. For instance, other numbers of signal lines and/or delays per signal lines may be employed.

Accordingly, while the present invention has been disclosed in connection with exemplary embodiments thereof, it should be understood that other embodiments may fall within the spirit and scope of the invention, as defined by the following claims.

The invention claimed is:

1. A method of aligning signals from a first receiver located in a first clock domain to a second receiver located in a second clock domain, the method comprising the steps of:
    creating a programmable delay element between the first and second receivers wherein creating the programmable delay element comprises:
        providing at least one selectable delay for each of a first plurality of signal lines adapted to receive signals transmitted from the first receiver to the second receiver; and
        providing at least one selectable delay for each of a second plurality of signal lines adapted to receive signals transmitted from the second receiver to the first receiver; and
    selectively adding delay via the programmable delay element to the signals until the signals are aligned.

2. The method of claim 1 wherein creating the programmable delay element comprises providing at least one selectable delay for each of a plurality of signal lines between the first and second receivers.

3. The method of claim 2 wherein each selectable delay comprises a latch.

4. The method of claim 1 wherein:
    each selectable delay for the first plurality of signal lines comprises at least one latch that is clocked by a clock of the second clock domain; and
    each selectable delay for the second plurality of signal lines comprises at least one latch that is clocked by a clock of the first clock domain.

5. The method of claim 1 wherein selectively adding delay via the programmable delay element to the signals until the signals are aligned comprises:
    (a) testing operation of the first and second receivers in response to differing delays between signals transmitted between the first and second receivers;
    (b) determining one or more delays that cause the first and second receivers to exchange signals without errors; and
    (c) employing the one or more delays to align signals transmitted between the first and second receivers.

6. The method of claim 5 wherein steps (a)-(c) are performed automatically.

7. A method of aligning signals transmitted between a first receiver located in a first clock domain and a second receiver located in a second clock domain, the method comprising the steps of:
    (a) providing at least one selectable delay for each of a first plurality of signal lines adapted to receive signals transmitted from the first receiver to the second receiver;
    (b) providing at least one selectable delay for each of a second plurality of signal lines adapted to receive signals transmitted from the second receiver to the first receiver;
    (c) testing operation of the first and second receivers in response to differing delays between signals transmitted between the first and second receivers;
    (d) determining one or more delays that cause the first and second receivers to exchange signals without errors; and (e) employing the one or more delays during subsequent transmission of signals between the first and second receivers.

8. The method of claim 7 wherein steps (c)-(e) are performed automatically.

9. An apparatus for use with an asynchronous interface having first receiver that operates in a first clock domain, a second receiver that operates in a second clock domain, and a plurality of signal lines adapted to exchange signals between the first and second receivers, the apparatus comprising:
- a first clock domain portion having at least a first delay circuit adapted to selectively introduce a first delay to a signal traveling from the second receiver to the first receiver via a first of the plurality of signal lines; and
- a second clock domain portion having at least a second delay circuit adapted to selectively introduce a second delay to a signal traveling from the first receiver to the second receiver via a second of the plurality of signal lines.

10. The apparatus of claim 9 wherein:
the first clock domain portion includes a first plurality of delay circuits, each of the first plurality of delay circuits adapted to selectively introduce a delay to a signal traveling from the second receiver to the first receiver via a different one of a first plurality of signal lines; and
the second clock domain portion includes a second plurality of delay circuits, each of the second plurality of delay circuits adapted to selectively introduce a delay to a signal traveling from the first receiver to the second receiver via a different one of a second plurality of signal lines.

11. The apparatus of claim 10 wherein each delay circuit of the first plurality of delay circuits includes a plurality of selectable paths, each path having a different delay associated therewith.

12. The apparatus of claim 11 wherein each path has a different number of latches associated therewith.

13. The apparatus of claim 12 wherein at least one path has N−1 latches, wherein N equals the number of signal lines between the first and second receivers.

14. The apparatus of claim 10 wherein each delay circuit of the second plurality of delay circuits includes a plurality of selectable paths, each path having a different delay associated therewith.

15. The apparatus of claim 14 wherein each path has a different number of latches associated therewith.

16. An apparatus comprising:
an asynchronous interface having:
- a first receiver that operates in a first clock domain;
- a second receiver that operates in a second clock domain;
- a plurality of signal lines adapted to exchange signals between the first and second receivers;

a supplemental asynchronous interface device (SAID) comprising:
- a first clock domain portion having at least a first delay circuit adapted to selectively introduce a first delay to a signal traveling from the second receiver to the first receiver via a first of the plurality of signal lines; and
- a second clock domain portion having at least a second delay circuit adapted to selectively introduce a second delay to a signal traveling from the first receiver to the second receiver via a second of the plurality of signal lines.

17. The apparatus of claim 16 wherein the first receiver comprises a first state machine and the second receiver comprises a second state machine.

18. The apparatus of claim 16 wherein:
the plurality of signal lines comprises:
- a first plurality of signal lines that travel through the first portion of the SAID; and
- a second plurality of signal lines that travel through the second portion of the SAID;

the first clock domain portion includes a first plurality of delay circuits, each of the first plurality of delay circuits adapted to selectively introduce a delay to a signal traveling from the second receiver to the first receiver via a different one of the first plurality of signal lines; and the second clock domain portion includes a second plurality of delay circuits, each of the second plurality of delay circuits adapted to selectively introduce a delay to a signal traveling from the first receiver to the second receiver via a different one of the second plurality of signal lines.

19. A computer program product for aligning signals transmitted via an asynchronous interface between a first receiver located in a first clock domain and a second receiver located in a second clock domain, comprising: a medium readable by a computer, the computer readable medium having computer program code adapted to:
(a) test operation of the first and second receivers in response to differing delays between signals transmitted between the first and second receivers;
(b) determine one or more selectable delays that cause the first and second receivers to exchange signals without errors; and
(c) cause the asynchronous interface to employ the one or more selectable delays during subsequent transmission of signals between the first and second receivers wherein the asynchronous interface includes a plurality of signal lines.

* * * * *